US009568528B2

(12) United States Patent
Brandl et al.

(10) Patent No.: US 9,568,528 B2
(45) Date of Patent: Feb. 14, 2017

(54) ARRANGEMENT AND METHOD FOR OPERATING A SENSOR, IN PARTICULAR A BRIDGE SENSOR, AND A SENSOR ARRANGEMENT

(75) Inventors: Manfred Brandl, Gratwein (AT); Gernot Hehn, Graz (AT)

(73) Assignee: AMS AG, Unterpremstaetten (AT)

( * ) Notice: Subject to any disclaimer, the term of this patent is extended or adjusted under 35 U.S.C. 154(b) by 64 days.

(21) Appl. No.: 14/125,932

(22) PCT Filed: May 30, 2012

(86) PCT No.: PCT/EP2012/060155
§ 371 (c)(1),
(2), (4) Date: Mar. 6, 2014

(87) PCT Pub. No.: WO2012/171795
PCT Pub. Date: Dec. 20, 2012

(65) Prior Publication Data
US 2014/0182395 A1 Jul. 3, 2014

(30) Foreign Application Priority Data

Jun. 16, 2011 (DE) .................. 10 2011 104 307

(51) Int. Cl.
*G01L 3/02* (2006.01)
*G01R 27/26* (2006.01)
(Continued)

(52) U.S. Cl.
CPC ............ *G01R 27/2611* (2013.01); *G01D 5/16* (2013.01); *G01L 3/10* (2013.01); *G01R 27/08* (2013.01)

(58) Field of Classification Search
CPC ........... G01L 3/1414; G01L 3/10; G01D 5/16; G01R 27/2611; G01R 27/08
(Continued)

(56) References Cited

U.S. PATENT DOCUMENTS 4,092,852 A * 6/1978 Fowler et al. ............. 73/114.69
4,618,818 A * 10/1986 Horn ............................. 324/706
(Continued)

FOREIGN PATENT DOCUMENTS

CN  101738210 A  6/2010
DE  102005010932 A1  9/2006
(Continued)

OTHER PUBLICATIONS

Brandl et al, "Contactless Torque Sensor—Mechatronic Principle and Prototype Development for Automotive Applications", ICINCO 2009—6th International Conference on Informatics in Control, Automation and Robotics, 2009, pp. 55-61.

*Primary Examiner* — Max Noori
(74) *Attorney, Agent, or Firm* — McDermott Will & Emery LLP

(57) ABSTRACT

An arrangement for operating a sensor, in particular a bridge sensor, comprises a sensor input (Vin1, Vin2) for connecting the sensor (Brdg) and a clocked signal generator (Osc), which is coupled to the sensor input (Vin1, Vin2). Furthermore an amplifier (Amp) is provided for detecting sensor signals (Sn, Sn+1), which is connected on the input side to a signal input (IN+, IN−) for connecting the sensor (Brdg), wherein the detection takes place depending on the clock pulse of the signal generator (Osc). A signal processing device (PROC) is connected to an output (AOUT+, AOUT−) of the amplifier (Amp) and is arranged to demodulate the sensor signals (Sn, Sn+1) that follow one another according to the clock pulse.

13 Claims, 3 Drawing Sheets

Figure 1A:
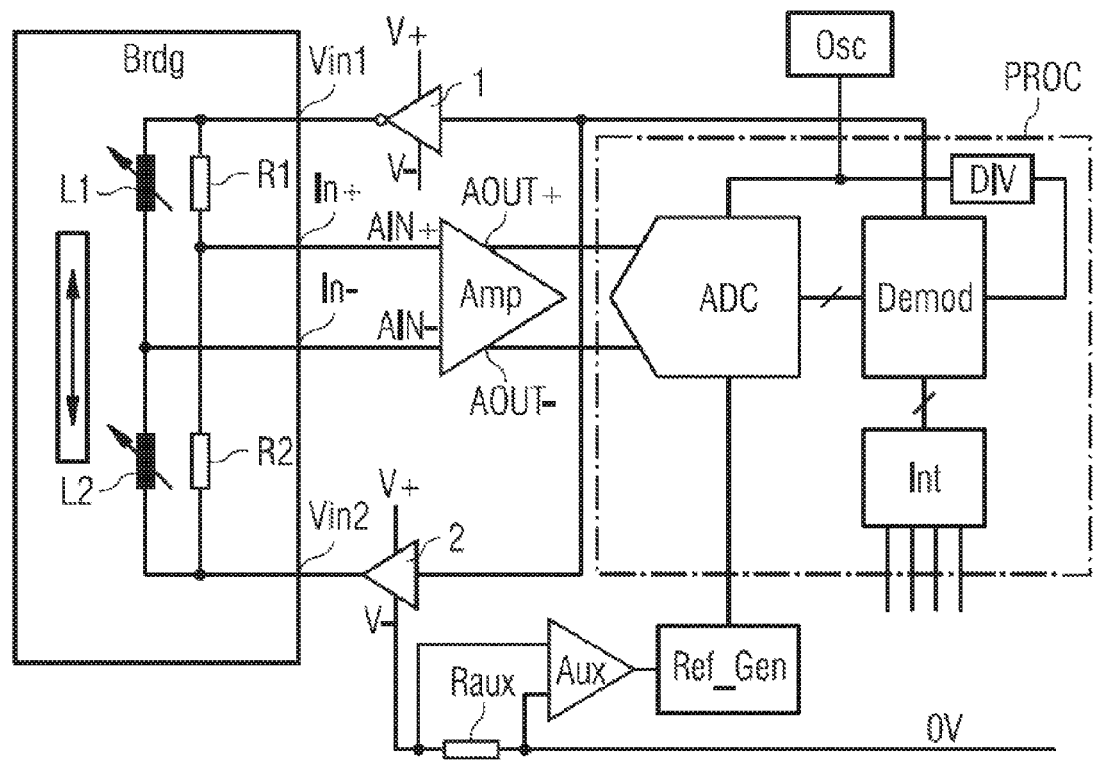

(51) Int. Cl.
*G01D 5/16* (2006.01)
*G01L 3/10* (2006.01)
*G01R 27/08* (2006.01)

(58) Field of Classification Search
USPC .............................. 73/777, 862.08, 862.191
See application file for complete search history.

(56) References Cited

U.S. PATENT DOCUMENTS

| | | | |
|---|---|---|---|
| 6,057,760 A * | 5/2000 | Dauphin | ............... G01S 15/523 340/426.26 |
| 7,562,591 B2 | 7/2009 | Lee | |
| 7,923,998 B2 | 4/2011 | Hammerschmidt | |
| 2001/0050552 A1* | 12/2001 | Sandquist et al. | ........ 324/117 R |
| 2002/0105423 A1* | 8/2002 | Rast | .............................. 340/479 |
| 2005/0129156 A1* | 6/2005 | Lourens et al. | ............... 375/350 |
| 2008/0012557 A1 | 1/2008 | Hammerschmidt | |
| 2008/0174302 A1 | 7/2008 | Lee et al. | |
| 2009/0102464 A1 | 4/2009 | Doogue et al. | |
| 2010/0053789 A1* | 3/2010 | Duric et al. | .................... 360/31 |

FOREIGN PATENT DOCUMENTS

| | | |
|---|---|---|
| DE | 102006032266 A1 | 1/2008 |
| DE | 112008000208 T5 | 12/2009 |
| JP | 08-094383 | 4/1996 |

\* cited by examiner

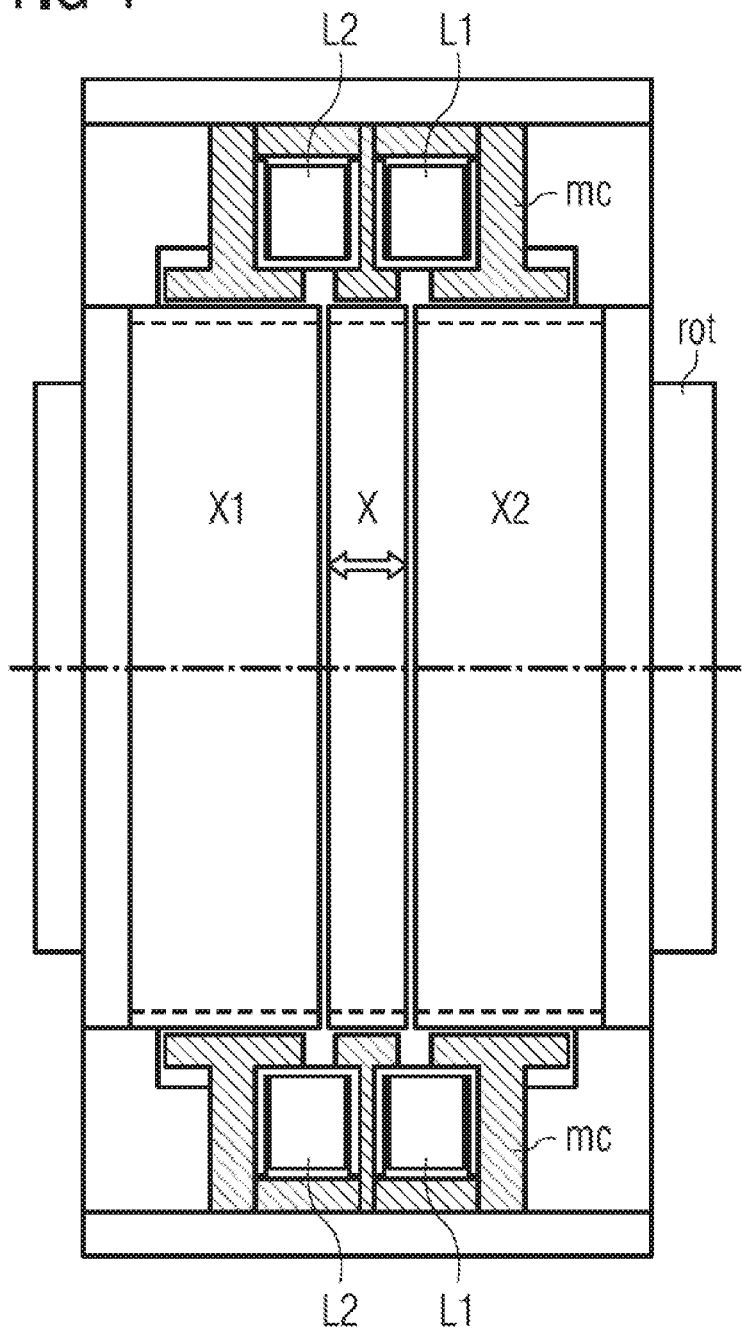

ARRANGEMENT AND METHOD FOR OPERATING A SENSOR, IN PARTICULAR A BRIDGE SENSOR, AND A SENSOR ARRANGEMENT

The invention relates to an arrangement and to a method for operating a sensor, in particular for operating a bridge sensor, and further relates to a sensor arrangement.

Position sensors are based on capacitive, magnetic, inductive, optical or resistive measurement principles. For applications that require a very high resolution and reliability and at the same time low costs, it is preferable to use inductive sensors. This sensor type is characterized by low long-term drifts and aging effects. In addition to costly optical interferometers, inductive sensor types are available particularly if a contact-free measurement is to be carried out in the nanometer or micrometer range.

Linearly variable differential transformers (LVDT) have been known for approximately a decade as an inductive sensor type for position determination. However, these sensors have linearity problems in the central range and they require the use of exotic and consequently usually expensive materials. In addition, complex sensor interfaces for the coil excitation and for the measured value conversion of the receiving coils are required. The subsequent signal processing is also expensive, and it must provide at least one AC signal conversion and subsequent analog-to-digital conversion.

Therefore, the object of the present invention is to provide an arrangement and a method for operating a sensor, in particular a bridge sensor, and a corresponding sensor arrangement, which allows a simpler signal processing with high resolution and reliability.

The object is solved by the subject matter of the independent claims. Advantageous variants and designs are the respective subject matter of dependent claims.

In an embodiment, an arrangement for operating a sensor, in particular a bridge sensor, comprises a sensor input for supplying the sensor. A clocked signal generator is coupled to the sensor input. An amplifier is connected on the input side to a signal input in order to be able to connect the sensor to the arrangement. Moreover, a signal processing device is provided, which is connected to the output of the amplifier.

As a function of a physical quantity, such as, for example, a position or a torque, the sensor generates a sensor signal. Via an appropriate sensor output, the sensor is connected to the sensor input of the arrangement, and supplies the recorded sensor signals at the sensor input. The sensor signal is applied to the amplifier and amplified. This takes place as a function of the clock pulse of the signal generator. In this manner, successive sensor values can be generated from the sensor signal.

The sensor signal that has been amplified in this manner or the sensor values are made available at the output of the amplifier, and in this manner they are applied to the signal processing device. The signal processing device is designed to demodulate the sensor signals that follow one another according to the clock pulse. This occurs according to a demodulation procedure. The signal processing device preferably comprises components for the intermediate storage of signal values, built, for example, from logic elements or memory components.

The proposed arrangement represents a general measurement interface, which can be used with a plurality of sensor types. This preferably includes bridge sensors, particularly on the basis of inductive and/or resistive measurement principles. Due to the plurality of possible sensor types, the arrangement can be used, for example, for signal processing in the case of linear and differential position sensors, proximity sensors, as well as in strain and pressure sensors.

Here, the modulation by means of the signal generator, for example, in the case of a coil excitation of an inductive bridge sensor, and the subsequent demodulation by means of the signal processing device, lead to several advantages. By appropriate demodulation of the sensor signals that follow one another, an offset and low-frequency noise are compensated. For this purpose, it is possible, for example, to provide the sensor values with alternating signs according to the clock pulse. If the demodulation takes into account, for example, a mean value, then the offset and low-frequency components are eliminated during the formation of the sum. In this manner, the arrangement has a high zero point stability. Due to the differential processing of sensor signals that follow one another, the arrangement has a satisfactory electromagnetic compatibility (EMC).

The arrangement allows a high linearity with simultaneously high resolution, which is limited substantially only by the signal processing device and the amplifier. Due to the offset compensation, a temperature drift is also reduced. Thus, using bridge sensors, reliable measurements, such as, for example, position measurements, are possible in the range of several nanometers or micrometers, with high reliability. This is particularly advantageous if small and minute mechanical deformations are to be measured. The arrangement is thus advantageously usable in torque and strain measuring devices.

The clock pulse of the signal generator is defined below by a periodic clock pulse signal, which repeats in accordance with a constant frequency or the clock pulse. The clock pulse can be defined on the basis of the period between two successive maxima or minima as well as by the frequency, which [sic] between the occurrence of two function values, for example, "high" and "low" of a binary rectangular function. Any periodic function can be used as the clock pulse signal. The clock pulse frequency is preferably a few kHz.

By means of the signal generator, the sensor signals are, in a manner of speaking, modulated and only appropriate sensor values are taken into consideration. Unless otherwise indicated, in the following, the terms sensor value as well as sensor signals that follow one after the other according to the clock pulse are be understood in that sense.

In a variant of the arrangement, the signal input has a first signal connection and a second signal connection. Accordingly, the amplifier has a first amplifier input and a second amplifier input. Here, the first amplifier input is connected to the first signal connection and the second amplifier input to the second signal connection.

The selected design with two signal inputs is here arranged for contacting a bridge sensor. For this purpose, a bridge sensor has a first and second sensor output and it can be connected along its bridge branch to the sensor arrangement.

The excitation of the bridge sensor at the sensor inputs of the arrangement occurs by means of the signal generator. As the bridge sensor, one can use, for example, inductive or resistive measurement bridges as well as combinations of these sensor types. The excitation occurs preferably at an excitation frequency of a few kHz.

In a variant of the arrangement, the cycle signal generator is arranged to generate an alternating signal, particularly a rectangular signal, for operating the sensor.

In a variant of the arrangement, the signal processing device comprises an analog-to-digital converter, which is connected to the output of the amplifier. Furthermore, a demodulator is provided, which is connected to the analog-to-digital converter. The analog-to-digital converter is preferably a monotonous sigma-delta modulator.

The analog-to-digital converter converts the analog sensor signals according to a respective clock pulse of the signal generator to digital signal values for further signal processing. The demodulator is arranged to carry out a digital demodulation of the sensor values according to a demodulation procedure. For this purpose, a mean value is preferably formed from the signal values, wherein two signal values that follow one another according to the clock pulse in each case present alternating signs. In this manner, an averaging function that runs concurrently with the clock pulse is implemented, in a manner of speaking.

The digitization and subsequent demodulation take the compensation of offset and low-frequency noise into consideration in a robust manner. As a result, a temperature-independent zero point in the signal processing path is achieved as well as a high resolution. In addition, if an analog-to-digital converter based on the principle of a sigma-delta modulator is used, hardly any linearity errors occur.

In a variant of the arrangement, the signal generator is connected by means of a synchronization output to the analog-to-digital converter and to the demodulator. Furthermore, the demodulator couples the signal generator to the sensor connection.

By means of the synchronization output or the signal generator, the sensor, the analog-to-digital converter, and the demodulator are synchronized to the clock pulse.

In a variant of the arrangement, a signal output of the demodulator is connected to a digital interface of the arrangement.

In an embodiment of a method for operating a sensor, in particular a bridge sensor, a pulsed signal is first supplied by a signal generator. As a function of a physical quantity to be recorded, for example, a position or torsion, a sensor signal is detected. According to the clock pulse of the signal generator, sensor values that follow one another in time are derived from the sensor signal. The sensor values that follow one another according to the clock pulse are demodulated to form a combined sensor signal.

The method allows a high linearity with simultaneous high resolution. In particular, the combined sensor signal is offset-compensated and as a result, a temperature drift is clearly reduced. In this manner, reliable position measurements, for example, using inductive bridge sensors, are possible in the range of a few nanometers or micrometers with high reliability. This is particularly advantageous if small or minute mechanical deformations are to be measured. The arrangement can thus be used advantageously in torque and strain measuring devices.

In a variant of the method, the detected sensor signals are first digitized. In each case two sensor signals that follow one another according to the clock pulse are then demodulated to form the combined sensor signal.

Alternatively or additionally, it is also possible to take into consideration more than two sensor signals that follow one another.

In a variant of the method, the detection and demodulation occur synchronously by means of the clocked signal. For this purpose, it is preferable to form a mean value from the signal values, wherein two signal values that follow one another according to the clock pulse have in each case alternating signs. In this manner, an averaging function that in a manner of speaking runs concurrently with the clock pulse is defined, and that by calculation eliminates both an offset as well as low-frequency noise in a robust manner.

According to an embodiment of a sensor arrangement, the latter comprises an above-described arrangement and a sensor.

In a variant of the sensor arrangement, the sensor comprises a bridge sensor.

According to a variant of the sensor arrangement, the bridge sensor can comprise an inductive measurement bridge, a resistive measurement bridge, or a combination, that is to say, an inductive-resistive measurement bridge.

According to a variant of the sensor arrangement, the bridge sensor is designed as a torque sensor.

According to a variant of the sensor arrangement, the bridge sensor is used to detect the torque acting on a shaft. For this purpose, a generator is arranged on the shaft, and the bridge sensor is implemented as an inductive measurement bridge. The generator has in the axial direction of the shaft two outer generator segments and a central generator segment. The bridge sensor is here associated with the generator segments, and thus it forms the measurement bridge.

The outer generator segments and the central generator segment work together in such a manner that a torsion of the outer generator segments with respect to one another generates a movement of the central generator segment in the axial direction. Depending on this torsion, the bridge sensor generates the sensor signals, which are supplied as a differential sensor signal at the signal input of the arrangement.

The invention is explained in further detail below using several embodiment examples in reference to figures. To the extent that the circuit parts or components correspond to each other in terms of their function, their description is not repeated in each of the following figures.

Figure 1B:
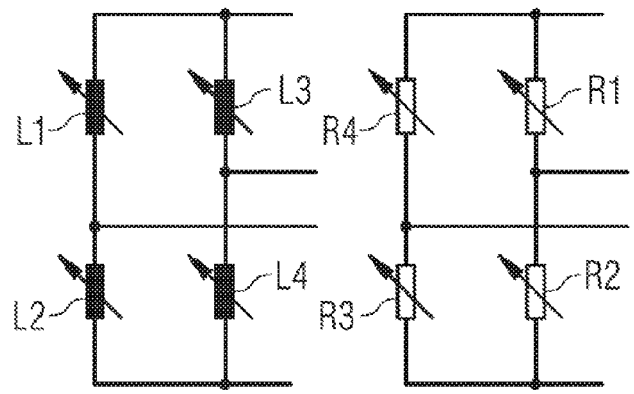
Figure 2:
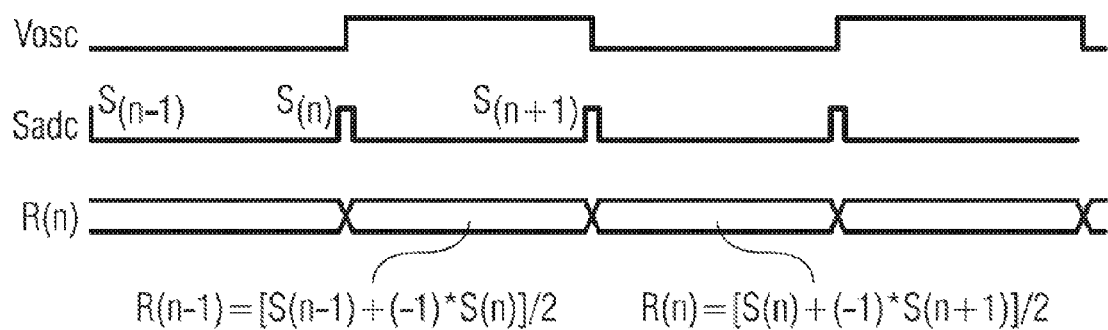
Figure 3:
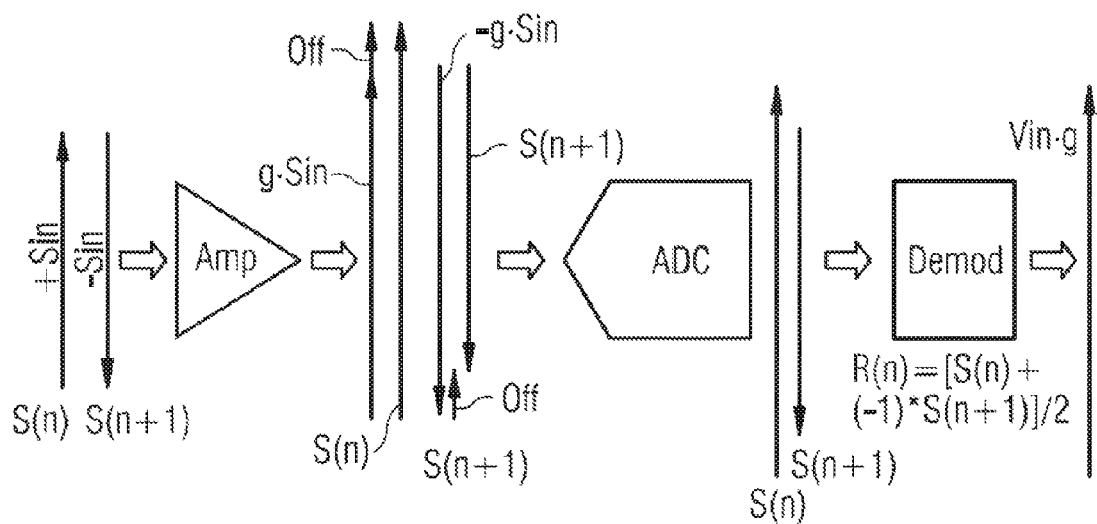

In the drawings:

FIG. 1A shows an example of an embodiment of an arrangement for operating a sensor according to the proposed principle, FIG. 1B shows an example of bridge sensors for use with the arrangement for operating a sensor according to the proposed principle, FIG. 2 shows an example of a clock pulse scheme for operating the sensor arrangement according to the proposed principle, FIG. 3 shows an example of a process sequence for operating a sensor arrangement according to the proposed principle, and FIG. 4 shows an example of a sensor arrangement for torsion measurements according to the proposed principle.

FIG. 1A shows an example of an embodiment of an arrangement for operating a sensor. The used sensor Brdg comprises a bridge circuit made of inductive and resistive elements. In each case, a voltage divider consisting of settable inductances L1, L2 and resistors R1, R2 is connected to a full-bridge circuit. The inductive and resistive voltage dividers are each connected to sensor inputs Vin1, Vin2. The connection branch of the bridge sensor Brdg is applied by means of sensor outputs IN+, IN− to an amplifier Amp. For this purpose, the amplifier Amp has appropriate amplifier inputs AIN+, AIN−. The amplifier Amp in turn is connected by means of two amplifier outputs AOUT−, AOUT+ to an analog-to-digital converter ADC. The analog-to-digital converter ADC is coupled to a demodulator DEMOD, which is connected to a digital interface INT.

Moreover, a signal generator Osc is provided, which is connected for clocking the analog-to-digital converter ADC and for synchronizing the demodulator DEMOD both to the analog-to-digital converter ADC and, preferably by means of a divider DIV, also to the demodulator DEMOD. The divider DIV is used to divide or scale the frequency of the signal generator Osc. This frequency is 2 MHz, for example. The divider DIV divides said frequency in accordance with a partition factor, for example, 1024 or 512, so that a frequency of 2 kHz, for example, is applied to said demodulator, which is a frequency that is processed better by said demodulator DEMOD. An output of the demodulator DEMOD is coupled to the sensor inputs Vin1, Vin2. This coupling occurs via a first and second driver 1, 2, which are respectively supplied with the supply voltages V+, V−. Here, the second driver 2 is inverting, for example. In an embodiment, the drivers 1, 2 comprise an H-bridge control, in order to apply an alternating current to the sensor Brdg.

In general, a drift of the arrangement is defined as drift of the analog-to-digital converter ADC multiplied by the amplifier drift. In the case where the reference of the analog-to-digital converter ADC is a representation of the clocked signal, only the amplifier drift remains as an influencing quantity.

Optionally the sensor Brdg is coupled, for example, by means of the sensor input Vin2 and of an auxiliary amplifier Aux, to a reference unit. The latter comprises an auxiliary amplifier AUX between the inputs of which a measuring resistor RAUX is connected. An output of the auxiliary amplifier AUX modulates a reference generator REF_GEN, which is applied to the analog-to-digital converter ADC.

During the operation of the circuit, the signal generator Osc supplies a clock pulse T. The clock pulse has, for example, a frequency of several kHz, which is limited by the bandwidth of the analog-to-digital converter ADC. However, the frequency is at the same time sufficiently high so that the inductances L1, L2 fulfill the function of an inductive voltage divider.

Depending on the clock pulse, an alternating voltage between the supply voltage limits V−, V+ is applied to the sensor inputs Vin1, Vin2. For example, the signal generator Osc generates, by means of the drivers 1, 2, a rectangular voltage with edges V−, V+. In general, alternating currents or alternating voltages can be used.

Depending on the clock pulse T, a supply signal with changing polarity is thus applied to the sensor inputs Vin1, Vin2. The bridge sensor Brdg generates a measurement signal Sn as a function of the excitation signal.

The resulting generated sensor signal Sn is made available by means of the bridge sensor Brdg at its sensor outputs IN−, IN+, and is fed, for example, into an integrated measurement circuit. By means of the amplifier inputs AN+, AN−, the sensor signal Sn is applied to the amplifier Amp and amplified there with an amplification factor g. This amplification is carried out as an analog amplification. Now, at the amplifier outputs AOUT+, AOUT−, the amplified sensor signal $$Sn \rightarrow Sn \cdot g$$

is applied and it is supplied to the analog-to-digital converter ADC. In the analog-to-digital converter ADC, a digitization of the sensor signal occurs synchronously with the clock pulse T of the signal generator Osc. The digital sensor values S(n) detected according to the clock pulse T are transmitted one after the other to the demodulator DEMOD, which is also synchronized according to the clock pulse T of the signal generator Osc.

The demodulation in the demodulator DEMOD occurs in each case on the basis of two signals S(n), S(n+1) that follow one another. For this purpose, the demodulator has appropriate delay elements, such as a memory or a register, or a corresponding logic. A combined demodulated signal Rn is supplied at an output of the demodulator DEMOD to a digital interface Int, and is made available for further signal processing.

The reference circuit REF is used as a reference for the analog-to-digital converter ADC and it can optionally be modulated by a measurement of the current of the sensor Brdg, for example, by measuring a bridge current, in such a manner that the temperature dependent ohmic components are compensated for, for example, in the inductances of the sensor Brdg. The temperature drift of the sensor, for example, of the ohmic components of the inductances, or a mechanical strain of the resistors of a bridge sensor, can also be taken into consideration by measuring a supply current of the sensor, multiplying it with an output, and comparing it with an output signal multiplied by a calibration factor at the digital interface Int.

FIG. 1B shows examples of bridge sensors according to the proposed principle. Besides the bridge sensor presented in FIG. 1A consisting of inductances L1, L2 and resistors R1, R2, additional bridge sensors are also possible. Here, a suitable bridge sensor Brdg can also consist of two adjustable voltage dividers on the basis of additional inductances L3, L4 or it can also comprise two voltage dividers on the basis of resistors R1, R2, R3, R4. Preferably, integrated full-bridge circuits, such as resistance strain gauges, are used with the presented elements.

FIG. 2 shows an example of a clock pulse scheme for operating a sensor arrangement according to the proposed principle. A clocked signal Vosc is shown, which is supplied as a function of the signal generator Osc at a clock pulse T to the bridge sensor Brdg. Depending on this excitation signal, the bridge sensor Brdg detects sensor values that follow one another according to the clock pulse T. According to the clock pulses TN−1, TN, TN+1, signal values S(n−1), S(n) and S(n+1) that follow one another are generated in this manner. Also synchronously with these signals that follow one another, a combined signal R(n) that is combined in each case from two signals that follow one another is demodulated.

FIG. 3 shows the process sequence according to the proposed principle in further detail. In accordance with the excitation signal Vosc, two sensor signals Sn and Sn+1 that follow one another are generated, for example, from a sensor signal Sin. Said sensor signals are amplified in the amplifier Amp in accordance with the amplifier factor g to analog signals $$g \cdot (Sn + \text{Off}) \text{ and } g \cdot (-Sn+1 + \text{Off}).$$

Here, an offset factor OFF must be taken into consideration during the amplification. Due to the rapid excitation in the range of several kilohertz, this offset factor OFF must be considered constant for two signals that follow one another.

By means of the analog-to-digital converter ADC, the sensor signals are digitized to sensor values S(n) and S(n+1). This information is reconstituted in the demodulator DEMOD by multiplying the negative sensor value S(n+1) that follows in each case by the factor −1, and adding the result to the previous sensor signal S(n) as a combined sensor signal $$Rn = [S(n) + (-1) \cdot S(n+1)]/2.$$

Due to the averaging that occurs in a manner of speaking concurrently with the clock pulse T, a same polarity of the signals Sn, Sn+1 is produced, and the offset factor OFF is eliminated by calculation. The result is a sensor signal Rn from which the offset has been removed, with a sampling rate that is twice that of the clock pulse T.

FIG. 4 shows an example of a sensor arrangement according to the proposed principle. The bridge sensor Brdg shown is designed especially for the purpose of measuring the torques or torsions of a rotating axle or rotating shaft. For this purpose, a support arrangement is provided, which comprises two outer generator segments X1, X2 that are firmly connected to the rotating shaft. Between these two outer generator segments, a central movable generator element X is located.

The support arrangement is surrounded by a magnetic measuring bridge consisting of two inductances L1, L2. The latter are series connected as voltage dividers. The inductances L1, L2 are led coaxially around the shaft and the support arrangement. Here, the inductances L1, L2 in each case comprise magnet cores and consist of magnetic field concentrators MC. The two inductances L1, L2 are completed, for example, with resistors R1, R2 to form the measurement bridge (not shown).

During the operation of the sensor arrangement, the signal generator Osc modulates the presented measurement bridge in the manner described in reference to FIGS. 1 to 3. Under the load of the rotating shaft, said generator is exposed to a certain torque or to a torsion, which is transmitted to the outer generators X1, X2. The outer generators are shaped in such a manner that they receive the torsion of the rotating shaft, and convert it into a rotating movement of the outer generator segments. For this purpose, the outer generators X1, X2 have a sheath-shaped support arrangement, which is designed in such a manner that, on the shaft side, the two end areas are firmly connected to the shaft, while the middle area is free of the shaft. On the side turned toward the shaft, the support arrangement is structured in accordance with the connection to the three generator segments into three segment areas.

In the case of torsion, the central generator segment X thus moves between the outer generator segments X1, X2. The measurement bridge, which is equilibrated in the resting state, is thus led out of this base state, and a differential sensor signal Sn, Sn+1 is generated. This sensor signal depends linearly on the deflection of the central generator segment X, and it allows conclusions regarding the torsion or the applied torque.

LIST OF REFERENCE NUMERALS

1 Driver
2 Driver
ADC Analog-to-digital converter
AIN+ Amplifier input
AIN− Amplifier input
Amp Amplifier
AOUT+ Amplifier output
AOUT− Amplifier output
Brdg Sensor
DEMOD Demodulator
g Amplification factor
In+ Sensor input
In− Sensor input
Int Digital interface
L1 Inductance
L2 Inductance
L3 Inductance
L4 Inductance
mc Magnetic field concentrator
Off Offset
Osc Signal generator
PROC Signal processing device
R1 Resistor
R2 Resistor
R3 Resistor
R4 Resistor
Rn Combined sensor signal
rot Rotating shaft
Raux Measurement resistor
Ref_Gen Reference generator
Sadc Sensor signal
Sin Sensor signal
Sn−1 Sensor signal
Sn Sensor signal
Sn+1 Sensor signal
V+ Supply voltage
V− Supply voltage
Vin1 Sensor input
Vin2 Sensor input
Vosc Clock pulse signal
X1 Generator segment
X2 Generator segment
X Generator segment

What is claimed is:

1. An arrangement for operating a bridge sensor, comprising:
    a sensor input (Vin1, Vin2) for supplying the bridge sensor (Brdg);
    a clocked signal generator (Osc) which is coupled to the sensor input (Vin1, Vin2);
    an amplifier (Amp) for detecting sensor signals (Sn, Sn+1), which is connected on the input side to a signal input (IN+, IN−) for connecting the bridge sensor (Brdg), wherein the detection takes place depending on the clock pulse of the signal generator (Osc); and
    a signal processing device (PROC), which is connected to an output (AOUT+, AOUT−) of the amplifier (Amp) and which is arranged to demodulate successive sensor signals (Sn, Sn+1) that follow one another according to the clock pulse,
    wherein each pair of successive sensor signals (Sn, Sn+1) is demodulated into a series of successive combined sensor signals (Rn) according to a demodulation function.

2. The arrangement according to claim 1, wherein, for the connection of a first and second sensor output (Vout1, Vout2) of the bridge sensor (Brdg)
    the signal input (IN+, IN−) comprises a first signal terminal (IN+) and a second signal terminal (IN−), and
    the amplifier (Amp) comprises a first amplifier input (AIN+) and a second amplifier input (AIN−), wherein the first amplification input (AIN+) is connected to the first signal terminal (IN+), and the second amplifier input (AIN−) is connected to the second signal terminal (IN−).

3. The arrangement according to claim 1 or 2, wherein the clocked signal generator (Osc) is arranged to generate an alternating signal (Vosc), in particular a rectangular signal, for operating the bridge sensor (Brdg).

4. The arrangement according to claim 1 or 2, wherein the signal processing device (PROC) comprises:
    an analog-to-digital converter (ADC), which is connected to the output (AOUT+, AOUT−) of the amplifier (Amp); and
    a demodulator (Demod), which is connected to the analog-to-digital converter (ADC), and is arranged to carry out a digital demodulation of the sensor signals (Sn, Sn+1) according to a demodulation procedure.

5. The arrangement according to claim 1 or 2, wherein the signal generator (Osc) is connected by means of a synchronization output (Sync) to the analog-to-digital converter (ADC) and to the demodulator (Demod), and the demodulator couples the signal generator (Osc) to the sensor input (Vin1, Vin2).

6. The arrangement according to claim 1 or 2, wherein a signal output of the demodulator (Demod) is connected to a digital interface (Int) of the arrangement.

7. A method for operating a bridge sensor, comprising:
providing a clocked signal (Vosc) by means of a signal generator (Osc);
detecting a measured quantity and delivering successive sensor signals (Sn, Sn+1) using a bridge sensor, wherein successive sensor signals (Sn, Sn+1) follow one another according to the clock pulse and are a function of the measured quantity; and
demodulating pairs of successive sensor signals (Sn, Sn+1) into a series of successive combined sensor signals (Rn) according to a demodulation function.

8. A method according to claim 7, wherein
the detected sensor values (Sn, Sn+1) are digitized, and
in each case two sensor signals (Sn, Sn+1) that follow one another according to the clock pulse are demodulated to the combined sensor signal (Rn).

9. A method according to claim 7 or 8, wherein the detection and demodulation by means of the clocked signal (Vosc) take place synchronously.

10. A bridge sensor arrangement comprising:
an arrangement according to claim 1 or 2; and
a bridge sensor (Brdg).

11. The bridge sensor according to claim 10, wherein the bridge sensor (Brdg) comprises:
an inductive measurement bridge;
a resistive measurement bridge; or
an inductive-resistive measurement bridge.

12. The bridge sensor according to claim 10, wherein the bridge sensor (Brdg) is implemented as a torque sensor.

13. A bridge sensor arrangement comprising:
an arrangement for operating a bridge sensor, comprising:
a sensor input (Vin1, Vin2) for supplying the bridge sensor (Brdg),
a clocked signal generator (Osc) which is coupled to the sensor input (Vin1, Vin2),
an amplifier (Amp) for detecting sensor signals (Sn, Sn+1), which is connected on the input side to a signal input (IN+, IN−) for connecting the bridge sensor (Brdg),
wherein the detection takes place depending on the clock pulse of the signal generator (Osc), and
a signal processing device (PROC), which is connected to an output (AOUT+, AOUT−) of the amplifier (Amp) and which is arranged to demodulate the sensor signals (Sn, Sn+1) that follow one another according to the clock pulse; and
the bridge sensor (Brdg),
wherein the bridge sensor (Brdg) is implemented as a torque sensor,
wherein the bridge sensor (Brdg) comprises, for the detection of a torque acting on a shaft (rot), a generator (X1, X2, X) arranged on the shaft (rot), and the bridge sensor (Brdg) implemented as an inductive measurement bridge,
wherein the generator (X1, X2, X) comprises in the axial direction of the shaft (rot) two outer generator segments (X1, X2) and a central (X) generator segment, which work together in such a manner that a torsion of the outer generator segments one against the other generates a movement of the central generator segment in the axial direction, and
wherein the bridge sensor (Brdg) is associated with the generator segments (X1, X2, X), in order to generate the sensor signals (Sn, Sn+1) as a differential signal, and in order to provide the differential signal at the signal input (IN+, IN−).

* * * * *